United States Patent
Nishioka et al.

(10) Patent No.: US 11,963,458 B2
(45) Date of Patent: Apr. 16, 2024

(54) MAGNETIC TUNNEL JUNCTION DEVICE, METHOD FOR MANUFACTURING MAGNETIC TUNNEL JUNCTION DEVICE, AND MAGNETIC MEMORY

(71) Applicant: TOHOKU UNIVERSITY, Miyagi (JP)

(72) Inventors: Koichi Nishioka, Miyagi (JP); Tetsuo Endoh, Miyagi (JP); Shoji Ikeda, Miyagi (JP); Hiroaki Honjo, Miyagi (JP); Hideo Sato, Miyagi (JP); Sadahiko Miura, Miyagi (JP)

(73) Assignee: TOHOKU UNIVERSITY, Miyagi (JP)

( * ) Notice: Subject to any disclaimer, the term of this patent is extended or adjusted under 35 U.S.C. 154(b) by 752 days.

(21) Appl. No.: 16/971,797

(22) PCT Filed: Mar. 11, 2019

(86) PCT No.: PCT/JP2019/009734
§ 371 (c)(1),
(2) Date: Nov. 5, 2020

(87) PCT Pub. No.: WO2019/188203
PCT Pub. Date: Oct. 3, 2019

(65) Prior Publication Data
US 2021/0057641 A1 Feb. 25, 2021

(30) Foreign Application Priority Data
Mar. 30, 2018 (JP) .................. 2018-070254

(51) Int. Cl.
*H01L 27/22* (2006.01)
*G11C 11/16* (2006.01)
(Continued)

(52) U.S. Cl.
CPC ........... *H10N 50/10* (2023.02); *G11C 11/161* (2013.01); *H01L 27/105* (2013.01); *H01L 29/82* (2013.01);
(Continued)

(58) Field of Classification Search
CPC ....... G11C 11/161; G11C 11/16; G11C 11/41; G11C 11/1675; H10B 61/00; H10B 61/10;
(Continued)

(56) References Cited

U.S. PATENT DOCUMENTS 8,722,543 B2 * 5/2014 Belen ............... H10N 50/01
257/295
9,337,415 B1 * 5/2016 Oh ................ H10N 50/85
(Continued)

FOREIGN PATENT DOCUMENTS

JP  2010034153 A  2/2010
JP  2013115399 A  6/2013
(Continued)

OTHER PUBLICATIONS

International Preliminary Report on Patentability for related PCT App No. PCT/JP2019/009734 dated Mar. 24, 2020, 14 pgs.
(Continued)

*Primary Examiner* — Nikolay K Yushin
(74) *Attorney, Agent, or Firm* — Procopio, Cory, Hargreaves & Savitch LLP

(57) ABSTRACT

Provided are a magnetic tunnel junction dement suppressing diffusion and penetration of constituent elements between a hard mask film, and a magnetic tunnel junction film and a protection layer, and a method for manufacturing the magnetic tunnel junction element.

(Continued)

The magnetic tunnel junction element has a configuration in which a non-magnetic insertion layer (7) including Ta or the like is inserted beneath a hard mask layer (8).

10 Claims, 19 Drawing Sheets

(51) Int. Cl.
| | | |
|---|---|---|
| *H01L 27/105* | (2023.01) | |
| *H01L 29/82* | (2006.01) | |
| *H10B 61/00* | (2023.01) | |
| *H10N 50/01* | (2023.01) | |
| *H10N 50/10* | (2023.01) | |
| *H10N 50/80* | (2023.01) | |
| *H10N 50/85* | (2023.01) | |

(52) U.S. Cl.
CPC ............ *H10B 61/00* (2023.02); *H10N 50/01* (2023.02); *H10N 50/80* (2023.02); *H10N 50/85* (2023.02)

(58) Field of Classification Search
CPC ........ H10B 61/20; H10B 99/00; H10N 50/10; H10N 50/01; H10N 50/80; H10N 50/85; H01F 10/3254; H01F 10/32; H01F 10/3286; H01F 41/308; H01F 41/30; H01F 41/303; H01F 41/302; H01L 27/105; H01L 27/1214; H01L 27/1255; H01L 29/82; H01L 29/0895; H01L 29/66984; H01L 43/08; H01L 43/02; H01L 43/12
See application file for complete search history.

(56) References Cited

U.S. PATENT DOCUMENTS

| | | | |
|---|---|---|---|
| 9,620,706 B2* | 4/2017 | Lee | H10N 50/01 |
| 11,133,460 B2* | 9/2021 | Xue | H10N 50/10 |
| 11,563,169 B2* | 1/2023 | Sato | G11C 11/1673 |
| 2010/0020592 A1 | 1/2010 | Hosotani et al. | |
| 2012/0028373 A1* | 2/2012 | Belen | H10N 50/01 |
| | | | 428/411.1 |
| 2013/0163317 A1 | 6/2013 | Yamane et al. | |
| 2013/0241015 A1 | 9/2013 | Nomachi | |
| 2016/0126453 A1* | 5/2016 | Chen | G11C 11/16 |
| | | | 257/421 |
| 2016/0155931 A1* | 6/2016 | Lee | H10N 50/10 |
| | | | 257/421 |
| 2016/0197268 A1 | 7/2016 | Yakabe et al. | |
| 2016/0351799 A1* | 12/2016 | Xue | H10N 50/01 |
| 2017/0170393 A1* | 6/2017 | Xue | H10N 50/10 |
| 2019/0019944 A1* | 1/2019 | Sato | G11C 11/1695 |
| 2019/0103404 A1 | 4/2019 | Ito et al. | |
| 2019/0295617 A1* | 9/2019 | Wang | H01F 10/3272 |

FOREIGN PATENT DOCUMENTS

| | | | |
|---|---|---|---|
| JP | 2013140891 A | | 7/2013 |
| JP | 2015179694 A | | 10/2015 |
| JP | 2017183560 A | | 10/2017 |
| WO | WO 2017/086481 | * | 5/2017 |

OTHER PUBLICATIONS

Sato, H., et al., MgO/CoFeB/Ta/CoFeB/MgO Recording Structure in Magnetic Tunnel Junctions With Perpendicular Easy Axis, IEEE Transactions on Magnetics, 49(7), Jul. 2013, pp. 4437-4440.
Written Opinion for related PCT App No. PCT/JP2019/009734 dated May 21, 2019, 5 pgs.

* cited by examiner

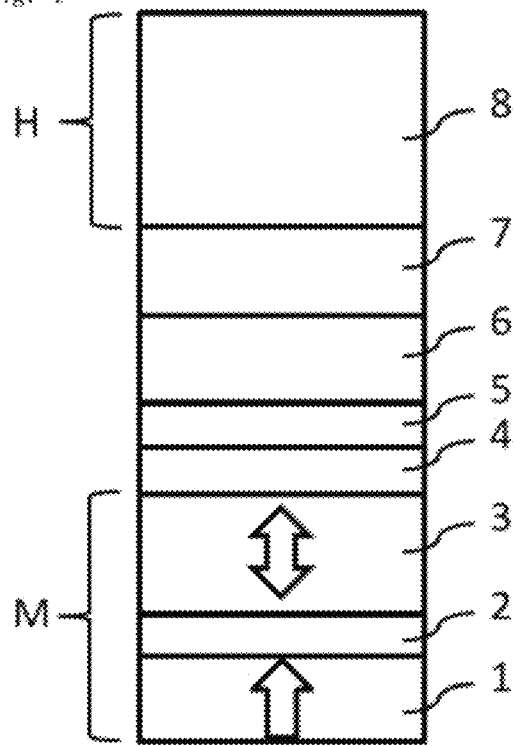
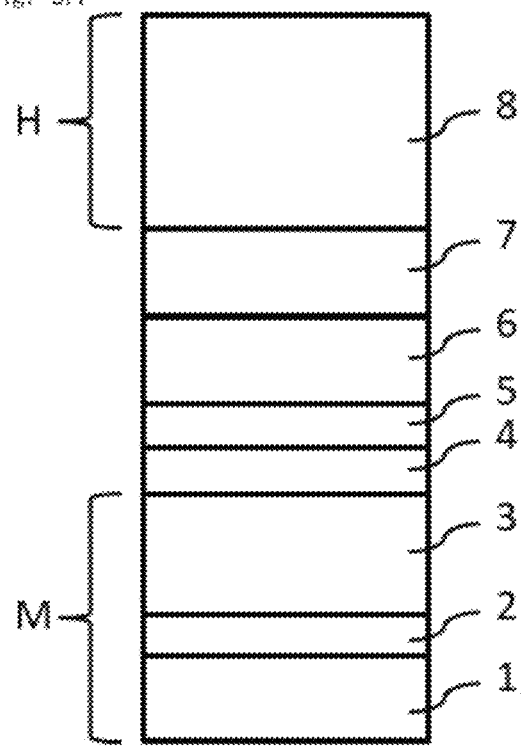

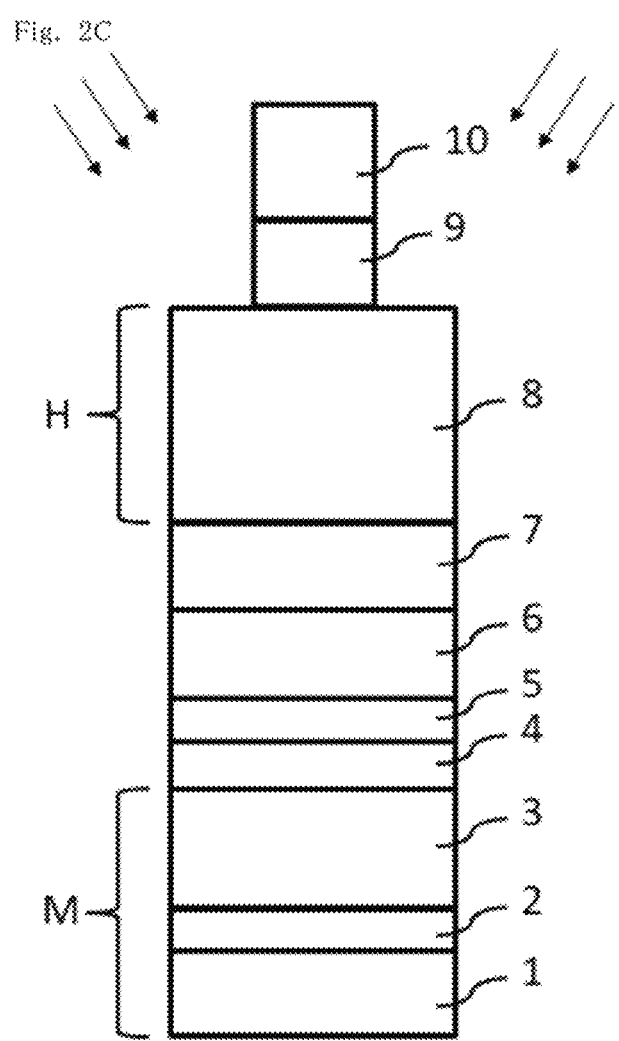

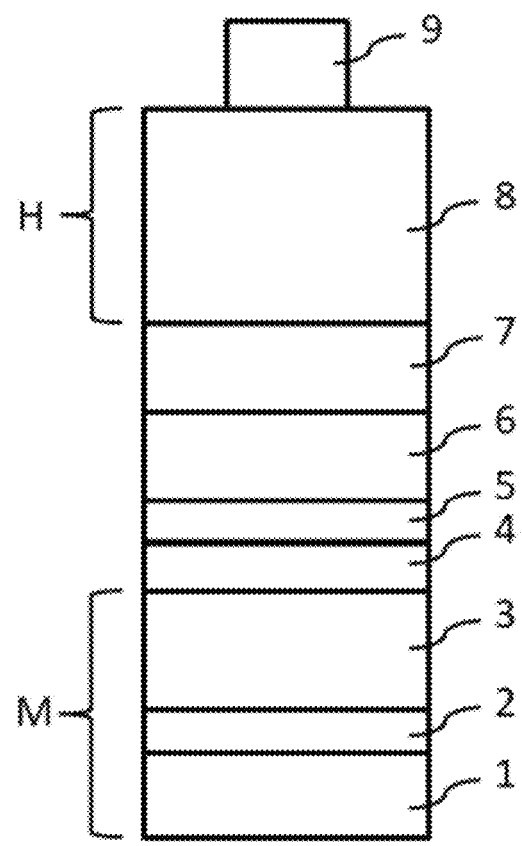

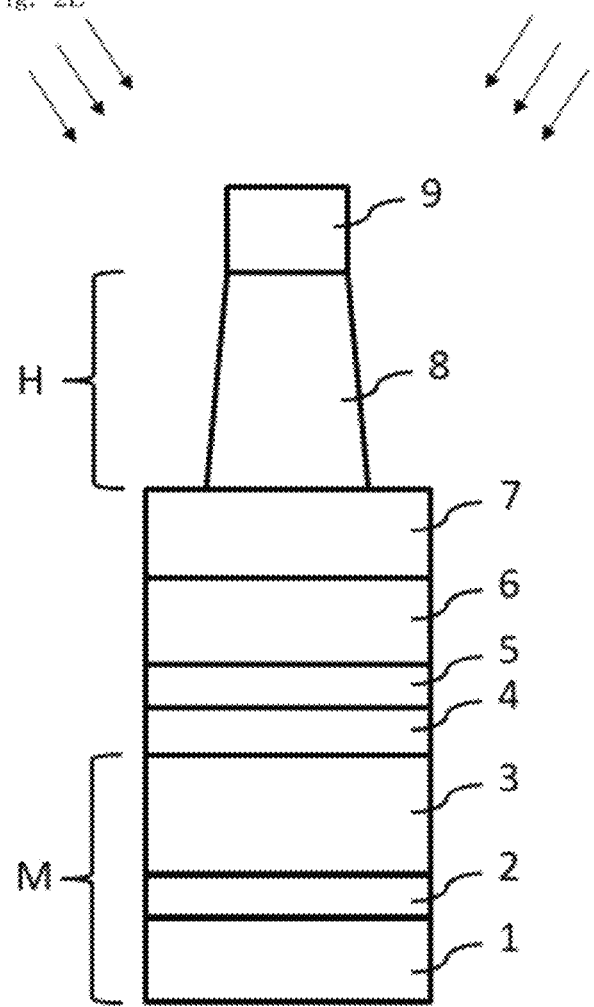

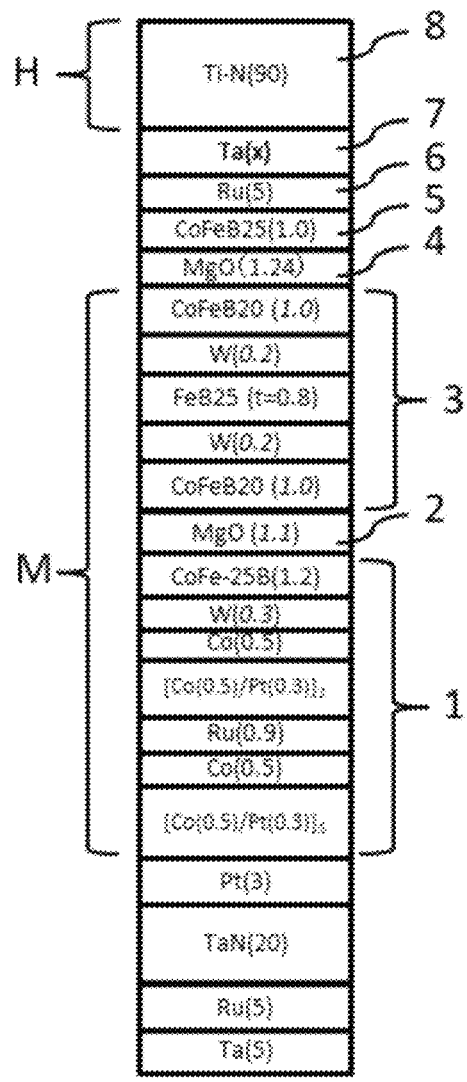

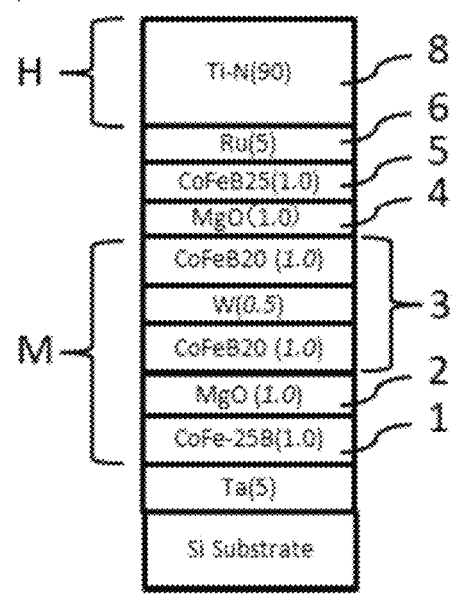

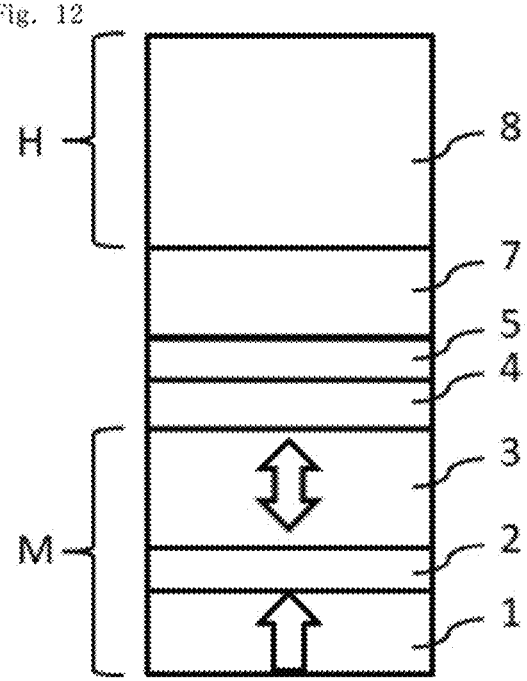

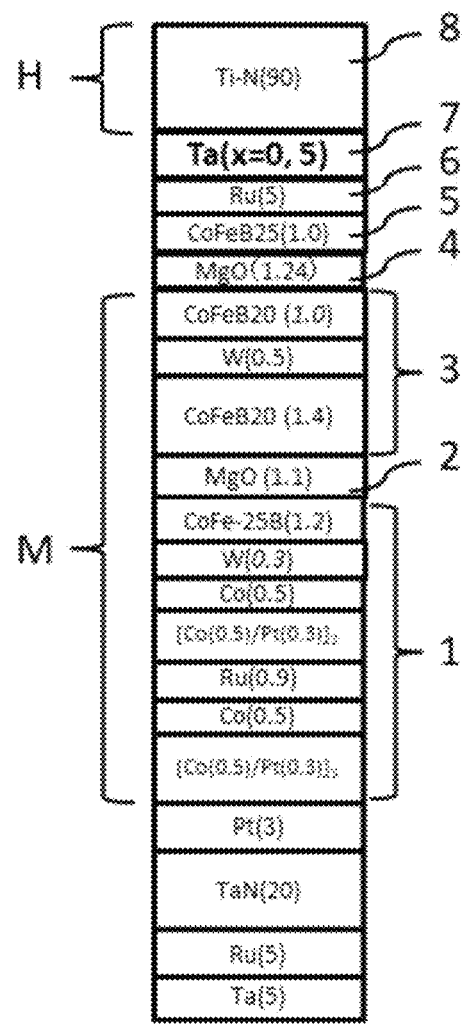

MAGNETIC TUNNEL JUNCTION DEVICE, METHOD FOR MANUFACTURING MAGNETIC TUNNEL JUNCTION DEVICE, AND MAGNETIC MEMORY

CROSS-REFERENCE TO RELATED APPLICATIONS

This application is a U.S. National Stage entry of PCT Application No: PCT/JP2019/009734 filed Mar. 11, 2019, which claims priority to Japanese Patent Application No. 2018-070254 filed Mar. 30, 2018, the contents of which are incorporated herein by reference.

TECHNICAL FIELD

The present invention relates to a magnetic tunnel junction element, and a method for manufacturing the magnetic tunnel junction element. More particularly, the present invention relates to an element configuration for improving the interlayer diffusion of an element in a processing step of a magnetic tunnel junction element, and a manufacturing method in which the processing step is improved.

BACKGROUND ART

A MRAM (Magnetic Random Access Memory: magnetic memory) is a nonvolatile memory that uses MTJ (Magnetic Tunnel Junction).

The MRAM not consuming electric power when on standby, and exhibiting high-speed performance and having high writing resistance, and moreover capable of being miniaturized to 10 nm or less receives attention as a next-generation logic integrated circuit.

The MRAM has a magnetic memory cell having a structure in which a selection transistor and a magnetic tunnel junction element are electrically coupled in series with each other.

The source electrode of the selection transistor is electrically coupled to a source line, the drain electrode is electrically coupled to a bit line via a magnetic tunnel junction element, and the gate electrode is electrically coupled to a word line.

The magnetic tunnel junction element basically has a structure in which a non-magnetic layer (tunnel barrier layer) is sandwiched between two magnetic layers (a reference layer and a recording layer) each including a ferromagnetic body. One of the magnetic layers is a reference layer having a magnetization direction that is fixed, and the other of the magnetic layers is a recording layer having a magnetization direction that is variable.

The resistance value of the magnetic tunnel junction element decreases when the magnetization direction of the magnetic layer of the reference layer and the magnetization direction of the magnetic layer of the recording layer are arranged in parallel with each other, whereas, the resistance value increases when the directions are arranged in antiparallel with each other. The magnetic memory cell of the MRAM allocates such two resistance stales to bit information "0" and "1".

Incidentally, in order to incorporate a magnetic tunnel junction element, which has a high tunnel magnetoresistance ratio (TMR ratio), a low writing current $I_C$, a high thermal stability index $\Delta$, and a small element size to be enhanced for its functionality, into a MRAM, it is necessary to process the element into a prescribed junction size or shape after lamination and annealing treatment. Further, for an electric coupling with a selection transistor, it is necessary to form a layer that can serve as an electrode at the upper part and the lower part of the magnetic tunnel junction element, after processing (see PTL 1).

Further, the following is disclosed in which, by implementing a double CoFeB/MgO interfacial recording layer structure to increase the thickness of the magnetic layer of the recording layer, a magnetic tunnel junction element having a high thermal stability index $\Delta$ is obtained (see, NPL 1 or the like). In performing this step, it is also important not to deteriorate, in a structural sense, MgO as a protection layer that is provided at a portion close to the electrode in the annealing treatment and processing treatment.

CITATION LIST

Non Patent Literature

[NPL 1] H. Sato, M. Yamanouchi, S. Ikeda, S. Fukami, F. Matsukura, and H. Ohno, "MgO/CoFeB/Ta/CoFeB/MgO recording structure in magnetic tunnel junctions with perpendicular easy axis", IEEE Trans. Magn., 2013, 49, 4437

PATENT LITERATURE

[PTL 1] Japanese Patent Application Publication No. 2013-140891

SUMMARY OF INVENTION

Technical Problem

In the prior art, processing of a magnetic tunnel junction element is performed through implementation of: a stage of laminating a magnetic tunnel junction film including a reference layer, a tunnel barrier layer, and a recording layer, then, if required, laminating thereabove a protection layer of MgO, CoFeB, or the like, laminating thereabove a hard mask layer of TiN or the like, and performing annealing treatment; and a stage of, after the annealing treatment, laminating a sacrificial layer including Si, forming a photoresist on the sacrificial layer, performing etching using etching selectivity, thereby processing a hard mask film.

However, the present inventors have found through the study on the processing step a following problem in that, although TiN is superior as a hard mask material, diffusion of constituent elements is caused between the hard mask film, and the magnetic tunnel junction film and the protection layer by the annealing treatment. The diffused Ti or N penetrates into the magnetic tunnel junction film, thereby deteriorating perpendicular magnetic anisotropy of the magnetic tunnel junction film (which will be described later referring to FIGS. 3A and 3B to 9A and 9B, and the like).

In view of the foregoing circumstances, the present invention has been completed by developing a layer configuration whereby diffusion of constituent elements is prevented from being caused between the hard mask film, the magnetic tunnel junction film and the protection layer, and a method for manufacturing a magnetic tunnel junction element.

More specifically, a magnetic tunnel junction element is configured such that a non-magnetic insertion layer is inserted between a hard mask film and a protection layer, thereby preventing diffusion of Ti, N, and the like of the hard mask film, and penetration thereof into the magnetic tunnel junction film, and suppressing the deterioration of perpendicular magnetic anisotropy of the magnetic tunnel junction film.

Solution to Problem

In order to solve the problem, a magnetic tunnel junction element of the present invention includes: a reference layer (1) having a magnetization direction that is fixed, a tunnel barrier layer (2) disposed adjacent to the reference layer (1), a recording layer (3) having a magnetization direction that is variable, and disposed adjacent to the tunnel barrier layer (2) on an opposite side thereof to the reference layer (1), a first protection layer (4) disposed adjacent to the recording layer (3) on an opposite side thereof to the tunnel barrier layer (2), a second protection layer (5) disposed adjacent to the first protection layer (4) on an opposite side thereof to the recording layer (3), a non-magnetic insertion layer (7) disposed adjacent to the second protection layer (5) on an opposite side thereof to the first protection layer (4), and a hard mask layer (8) disposed adjacent to the non-magnetic insertion layer (7) on an opposite side thereof to the second protection layer (5), wherein the reference layer (1) includes a ferromagnetic body, the tunnel barrier layer (2) includes O, the recording layer (3) includes a ferromagnetic body including at least any of Co, Fe, or Ni, the first protection layer (4) includes O, the second protection layer (5) includes at least one from the group consisting of Ru, Co, Fe, CoB, FeB, CoFe, or CoFeB, the non-magnetic insertion layer (7) includes at least one from the group consisting of Ta, Ir, Nb, Mo, Hf, W, or Pt, the hard mask layer (8) is a metal material including Ti or N, and the reference layer (1), the tunnel barrier layer (2), and the recording layer (3) configure a magnetic tunnel junction film (M) and the reference layer (1) and a magnetic direction of each of the recording layer (3) is perpendicular to a film surface.

The film thickness of the non-magnetic insertion layer (7) is desirably 1 nm or more.

The non-magnetic insertion layer (7) is desirably Ta.

The first protection layer (4) is desirably MgO.

It is preferable that a third protection layer (6) is further disposed adjacent to and between the second protection layer (5) and the non-magnetic insertion layer (7), and that the third protection layer (6) includes at least one from the group consisting of Ru, Rh, Cu, Ir, Au, Hf, W, Zr, Nb, Mo, Ti, V, or Cr, or an alloy thereof.

Further, a method for manufacturing a magnetic tunnel junction element of the present invention includes the steps of: sequentially laminating a magnetic tunnel junction film (M) including at least a reference layer (1), a tunnel barrier layer (2), and a recording layer (3), a first protection layer (4), a second protection layer (5), a non-magnetic insertion layer (7), and a hard mask layer (8); annealing the laminated film; laminating a sacrificial layer (9) including at least Si on the hard mask layer (8) subjected to annealing; forming on a part of the sacrificial layer (9) a photoresist (10) having a processed pattern shape of the magnetic tunnel junction film (M) in a top view; performing etching using the photoresist (10) as a mask and processing the sacrificial layer (9); performing etching using the sacrificial layer (9) as a mask and processing the hard mask layer (8); performing etching using the hard mask layer (8) as a mask and processing tie magnetic tunnel junction film (M); and removing the sacrificial layer (9), and is characterized in that the reference layer (1) include a ferromagnetic body; the tunnel hairier layer (2) includes O; the recording layer (3) includes a ferromagnetic body including at least any of Co, Fe, or Ni; the first protection layer (4) includes O; the second protection layer (5) includes at least one from the group consisting of Ru, Co, Fe, CoB, FeB, CoFe, or CoFeB; the third protection layer (6) includes at least one front the group consisting of Ru, Rh, Cu, Ir, Au, Hf, W, Zr, Nb, Mo, Ti, V, or Cr, or an alloy thereof; the non-magnetic insertion layer (7) includes at least one from the group consisting of Ta, Ir, Nb, Mo, Hf, W, or Pt; the hard mask layer (8) is a metal material including Ti or N; and a magnetization direction of each of the reference layer (1) and the recording layer (3) is perpendicular to a film surface.

It is also acceptable that in the annealing step, an annealing temperature is about 400° C., and annealing time is 1 hour.

It is also acceptable that the etching in the step of processing the hard mask layer (8), and the etching in the step of processing the magnetic tunnel junction film (M) are each reactive ion etching or ion beam etching, and that an incident angle of an ion beam is 50° to 90° with respect to a direction perpendicular to a film surface.

A magnetic memory of the present invention includes the magnetic tunnel junction element.

Advantageous Effects of Invention

The present invention can provide a magnetic tunnel junction element and a magnetic memory, in which unnecessary interlayer diffusion of the element constituent element is suppressed, particularly, Ti or N in the hard mask film (H) is prevented from penetrating into the magnetic tunnel junction film, decomposition of oxygen from a first protection layer or a magnetic tunnel layer including oxygen is prevented, and the deterioration of the perpendicular magnetic anisotropy of the magnetic tunnel junction film is suppressed. Further, the present invention can provide a method for manufacturing a magnetic tunnel junction element excellent in controllability of the processing shape of the magnetic tunnel junction film, and suppressed in deterioration of the perpendicular magnetic anisotropy of the magnetic tunnel junction film.

BRIEF DESCRIPTION OF DRAWINGS

FIG. 1 is a longitudinal cross section view of one example of a configuration of a magnetic tunnel junction element of the present invention.

FIG. 2A is a longitudinal cross section view showing one example of a configuration in an annealing step of a method for manufacturing the magnetic tunnel junction element of the present invention.

FIG. 2C is a longitudinal section view shoving one example of a configuration, and an etching state in a sacrificial layer processing step of the method for manufacturing the magnetic tunnel junction element of the present invention.

FIG. 2D is a longitudinal section view shoving one example of a configuration, and a photoresist removal state in a photoresist removing step of the method for manufacturing the magnetic tunnel junction element of the present invention.

FIG. 2E is a longitudinal section view shoving one example of a configuration, and an etching state in a hard mask film processing step of the method for manufacturing the magnetic tunnel junction element of the present invention.

FIG. 3A is a longitudinal section view shoving a configuration of an evaluating magnetic tunnel junction element.

FIG. 5A is a longitudinal cross section view showing a configuration for use in SIMS analysis of a magnetic tunnel junction film without Ta insertion of a conventional example.

FIG. 12 is a longitudinal cross section view of another example of the configuration of the magnetic tunnel junction element of the present invention.

FIG. 13 is a longitudinal cross section vie of a still other example of the configuration of the magnetic tunnel junction element of the present invention.

DESCRIPTION OF EMBODIMENTS

Figure 2B:
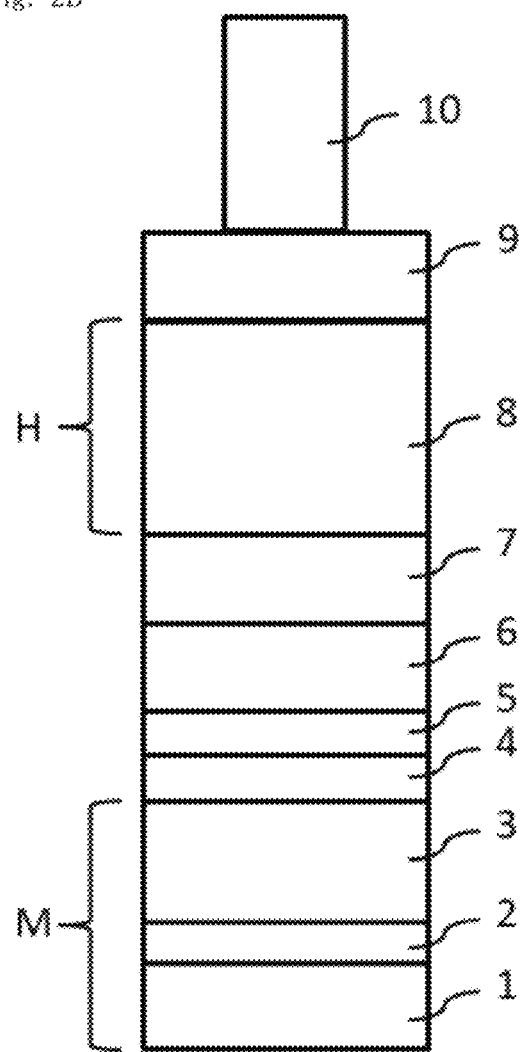
FIG. 2B is a longitudinal cross section view showing one example of a configuration in a photoresist or the like forming step of the method for manufacturing the magnetic tunnel junction element of the present invention.

Below, with referring to the accompanying drawings, a magnetic tunnel junction element, and a method for manufacturing a magnetic tunnel junction element of the present invention will be described in detail.

Incidentally, each drawing is merely an example, and will be described by being given a reference numeral and sign, which does not limit the present invention at all.

Embodiment 1

Configuration of Element

FIG. 1 shows the basic configuration of Embodiment 1 of the present invention. The basic configuration of the magnetic tunnel junction element includes reference layer (1)/ tunnel barrier layer (2)/recording layer (3)/first protection layer (D/second protection layer (5)/third protection layer (6)/non-magnetic insertion layer (7)/hard mask layer (8) arranged sequentially adjacent to one another. The reference layer (1)/tunnel barrier layer (2)/recording layer (3) configure a magnetic tunnel junction film (M), and the hard mask layer (8) configures a hard mask film (H).

Incidentally, for Embodiment 1, the layer configuration shown in FIG. 1 is only required to include the layers arranged sequentially adjacent to one another. The laminating method, the lamination order, the vertical and horizontal orientations, and the like are not limited.

The magnetization direction of the reference layer (1) is fixed in the direction perpendicular to a film surface.

The reference layer (1) is a ferromagnetic body including at least any of Co, Fe, and Ni, and more preferably includes at least one third ferromagnetic transition metal element. Specific examples thereof may include Co, Fe, Ni, CoFe, FeNi, CoNi, CoB, FeB, FeNi, CoFeB, FePt, TbTeCo, MnAl, and MnGa. The reference layer (1) may further include a non-magnetic element such as V, Ti, Cr, Zr, Nb, Mo, Hf, Ta, W, Si, Al, Pd, or Pt.

Further, a thin non-magnetic coupling layer may be inserted between the ferromagnetic bodies. Examples of the material for the non-magnetic coupling layer may include Ta, W, Hf, Zr, Nb, Mo, Ti, Mg, and MgO.

The reference layer (1) may include a monolayer, a laminated layer, or a multilayer, or may be a laminated layer with Pt, Ru, Ir, Rh, W, Ni, or the like, a thin film ferri structure, or the like. Further, a fixed layer or the tike may be provided adjacent to the reference layer (1) on the opposite side thereof to the tunnel barrier layer (2).

The film thickness of the reference layer (1) is roughly about 1 nm to 13 nm according to the material and the layer configuration.

The tunnel barrier layer (2) is a tunnel junction layer including an insulation layer including at least O (oxygen). An insulator including oxygen such as MgO, MgAlO, $Al_2O_3$, $SiO_2$, TiO, or $Hf_2O$ is used, and MgO is preferably used so that the magnetoresistance change rate may be expressed largely according to the combination of the materials of the two end faces to be joined.

Further, for the tunnel barrier layer (2), a material including oxygen is more desirably selected so us to cause interfacial magnetic anisotropy at the interface with the recording layer (3), and MgO is further desirable also in this regard.

The film thickness of the tunnel hairier layer (2) is adjusted within the range of preferably 0.1 to 10 nm, more preferably 0.2 nm to 5 nm, and still more preferably 0.5 nm to 2 nm.

The magnetization direction of the recording layer (3) is variable in a direction perpendicular to a film surface due to the interfacial magnetic anisotropy at interface with at least the tunnel barrier layer (2). When the first protection layer (4) is MgO, also at the interface between the recording layer (3) and the first protection layer (4), interfacial magnetic anisotropy is caused. For this reason, more perpendicular magnetic anisotropy is caused with respect to a film surface, and the thermal stability index Δ of the magnetic tunnel junction film (M) is more improved.

The recording layer (3) includes a ferromagnetic body including at least any of Co, Fe, and Ni, and more preferably includes at least one third ferromagnetic transition metal element. Specific exam pies thereof may include Co, Fe, Ni, CoB, FeB, FeNi, CoFeB, MnAl, and MnGa. The recording layer (3) may further include a non-magnetic element such as V, Ti, Cr, Zr, Nb, Mo, Hf, Ta, W, Si, Al, Pd, or Pt.

The recording layer (3) may include a monolayer or may include a laminated layer. Examples thereof may include a laminated layer film of a layer including Fe and a layer including FeB or CoB. In this case, it is more desirably configured such that MgO configuring the adjacent tunnel barrier layer (2) and the first protection layer (4) and the layer including B (such as FeB or CoB) of the recording layer (3) are not adjacent to each other. This is because a smaller amount of B at the interlace with MgO can provide higher interfacial magnetic anisotropy.

Further, a thin non-magnetic coupling layer may be inserted between the ferromagnetic bodies. Examples of the material for the non-magnetic coupling layer may include Ta, W, Hf, Zr, Nb, Mo, Ti, Mg, and MgO.

The film thickness of the recording layer (3) is preferably 0.6 nm to 6.0 nm, more preferably 1.0 nm to 5.0 nm, and still more preferably 1.0 nm to 3.0 nm.

The first protection layer (4) (cap layer) may include at least O (oxygen). Examples thereof may include insulators such as MgO, MgAlO, $Al_2Mo_3$, $SiO_2$, MgZnO, and $Ta_2O_5$, and conductive oxides such as $RuO_2$, $VO_2$, TiO, $Ti_2O_3$, ZnO, and $TaO_2$. Further, as the conductive oxide configuring the first protection layer (4), there may be included a rutile-$MoO_2$ type oxide such as $RuO_2$, $VO_2$, $CrO_2$, $NbO_2$, $MoO_2$, $WO_2$, $ReO_2$, $RhO_2$, $OsO_2$, $IrO_2$, $PtO_2$, $V_3O_5$, or $Ti_3O_5$; a NaCl type oxide such as TiO, VO, NbO, LaO, NdO, SmO, EuO, SrO, BaO, or NiO; a spinel type oxide such as $LiTi_2O_4$, $LiV_2O_4$, or $Fe_3O_4$; or a perovskite-$ReO_3$ type oxide such as $ReO_3$, $CaCrO_3$, $SrCrO_3$, $BaMoO_3$, $SrMoO_3$, $CaMoO_3$, $LaCuO_3$, $CaRuO_3$, $SrVO_3$, or $BaTiO_3$.

Further, for the first protection layer (4), a material including oxygen is more desirably selected, and MgO is further desirable so as to cause interfacial magnetic, anisotropy at the interface with the recording layer (3). In this case, the recording layer (3) sandwiched between the tunnel harrier layer (2) and the first, protection layer (4) causes interfacial magnetic anisotropy at the double interface. For this reason, more intense perpendicular magnetic anisotropy is caused with respect to the film surface, and the thermal stability index Δ of the magnetic tunnel junction film (M) is more improved.

The film thickness of the first protection layer (4) is adjusted within the range of preferably 0.1 to 10 nm, more preferably 0.2 nm to 5 nm, and still more preferably 0.5 nm to 3 nm.

The second protection layer (5) includes at least one from the group consisting of Ru, Co, Fe, CoB, FeB, CoFe, or CoFeB. These materials have a property of being less likely to damage MgO or the like of the first protection layer (4) arranged adjacent thereto.

The film thickness of the second protection layer (5) is adjusted within the range of not more than the thickness capable of performing processing of the magnetic tunnel junction film (M), and not less than the thickness causing the protection effect. In the case of Ru, the film thickness of the second protection layer (5) is set at preferably 3.5 nm or less, more preferably 0.3 nm to 3.0 nm, and still more preferably 0.5 nm to 2.0 nm. Also, in the case of CoFeB, the film thickness of the second protection layer (5) is set at preferably 3.5 nm or less, more preferably 0.1 nm to 3.0 nm, and still more preferably 0.1 nm to 1.5 nm.

The second protection layer (5) may include a simple substance or may include a laminated layer.

The layer of Co, Fe, CoB, FeB, CoFeB, or the like in the second protection layer (5) is a non-magnetic layer, and protects the first protection layer (4) disposed adjacent thereto. Accordingly, the second protection layer (5) is desirably formed with a film thickness not affecting the interfacial magnetic anisotropy energy density $K_i$. For example, the film thickness of the second protection layer (5) being set smaller than the film thickness of the recording layer (3) may be mentioned. Specifically, from the viewpoint of preventing the increase in saturation magnetization, the thickness of the second protection layer (5) is preferably set at 1.5 nm or less.

The material for the third protection layer (6) is preferably Ru, Rh, Cu, Ir, or Au, or an alloy thereof, or Hf, W, Zr, Nb, Mo, Ti, V, or Cr, or an alloy thereof, and Ru is more preferable.

The film thickness of the third protection layer (6) is preferably 2 nm or more, and more preferably 3.5 nm or more. Further, the third protection layer (6) may include a simple substance, or may include a laminated layer.

A non-magnetic insertion layer (7) is inserted between the hard mask film (H) and the third protection layer (6), and includes at least one from the group consisting of Ta, Ir, Nb, Mo, W, or Pt.

The non-magnetic insertion layer (7) is inserted in order to prevent the occurrence of unnecessary diffusion of the constituent element between the hard mask film (H) and the magnetic tunnel junction film (M), the first protection layer (4), the second protection layer (5), or the third protection layer (6). Particularly, the non-magnetic insertion layer (7) is inserted in order to prevent Ti, N, or the like configuring the hard mask film (H) from being diffused and penetrating into the magnetic tunnel junction film (M) during annealing, and deteriorating perpendicular magnetic anisotropy. Accordingly, the non-magnetic insertion layer (7) effectively includes an element with a high melting point, and a small diffusion coefficient. The non-magnetic insertion layer (7) includes an element with a melting point of 1,500° C. or more, and preferably 2,000° C. or more such as Ta (melting point 3,017° C.), Ir (melting point 2,443° C.), Nb (melting point 2,468° C.), Mo (melting point 2,623° C.), Hf (melting point 2,230° C.), W (melting point 3,407° C.), or Pt (melting point 1,768° C.), and more preferably includes Ta.

The film thickness of the non-magnetic insertion layer (7) is preferably 1.0 nm or more, more preferably 1.0 nm to 10 nm, and still more preferably 3 nm to 10 nm or 3 nm to 5 nm from the viewpoints of the evaluation results described later and element processing.

A hard mask layer (8) includes at least Ti or N so as to have electric conductivity in order to ensure a connection with an electrode. More preferable is TiN which is a material excellent in controllability of the processing shape by etching, has a smooth surface, and is excellent in adhesion. A layer including any of Ti or W, or a laminated layer thereof is also acceptable. The hard mask layer (8) it self may function as an electrode.

The film thickness of the hard mask layer (8) is preferably 20 nm to 200 nm, and more preferably 40 nm to 120 nm.

Further, the hard mask layer (8) is subjected to an annealing treatment together with the magnetic tunnel junction film (M), and the first protection layer (4), the second protection layer (5), and the third protection layer (6) further laminated thereon before processing by etching. In the present invention, the non-magnetic insertion layer (7) of a high-melting point heavy element material is inserted. For this reason, between the hard mask film (H) and the magnetic tunnel junction film (M), the first protection layer (4) such as MgO playing an important role in interfacial magnetic anisotropy, the second protection layer (5), or the third protection layer (6), unnecessary diffusion of a constituent element is suppressed, resulting in a configuration with which the perpendicular magnetic anisotropy of the magnetic tunnel junction film (M) is less likely to be deteriorated.

Structure of Element

Then, referring to FIGS. 2A to 2G, a description will be given to a method for processing (method for manufacturing) a magnetic tunnel junction element using the basic configuration of Embodiment 1 of the present invention.

FIG. 2A shows a longitudinal cross section view at the time point when an annealing step is performed after laminating, the magnetic tunnel junction film (M), the first protection layer (4), the second protection layer (5), the third protection layer (6), the non-magnetic insertion layer (7), and the hard mask film (H).

Any layer configuration before the annealing step is acceptable so long as the layers are sequentially arranged adjacent to one another as in FIG. 2A, and there is no restriction on the lamination method, the lamination order, the vertical and horizontal orientation, and the like.

The annealing step is performed at 400° C. for 1 hour.

FIG. 2B shows a longitudinal cross section view upon completion of a step of laminating u sacrificial layer (9) on the annealed hard mask layer (8), and forming a photoresist (10) on a part of the sacrificial layer (9).

The laminated layer of the sacrificial layer (9) and the formation of the photoresist (10) must be performed as the vertical positions described in FIG. 2B. This is because the subsequent step includes etching using an ion beam or the like.

For the sacrificial layer (9), a material may be adopted which can take the ratio (selectivity) of the etching rate of the hard mask and the etching rate of the sacrificial layer in processing by RIE (Reactive Ion Etching) or the like of the hard mask layer (8), and conversely has a higher etching rate as compared with the hard mask layer (8) by a proper etching method in the final removing step. A material including Si is preferable, and examples thereof may include $SiO_2$ and $Si_3N_4$. The sacrificial layer (9) can be laminated on the annealed hard mask layer (8) by a CVD (Chemical Vapor Deposition) method or the like.

The lamination of the sacrificial layer (9) between the hard mask layer (8) and the photoresist (10) is for adjusting the etching selectivity. For example, when etching is performed using a chlorine gas, the etching selectivity of TiN of the hard mask layer (8) to $SiO_2$ of the sacrificial layer (9) is 3.8.

The photoresist (10) is formed on a part of the sacrificial layer (9). The top view of the photoresist (10) is in the processed pattern shape of the magnetic tunnel junction film (M).

The material for the photoresist (10) is desirably an organic substance. When the sacrificial layer (9) is a non-organic substance, and hard, as the etching gas species, $CF_4$ or $CHCF_3$ is required to be selected in order to obtain etching selectivity.

The film thickness of the photoresist (10) is preferably 50 nm to 200 nm, and more preferably 80 nm to 120 nm. This is due to the flowing fact. When the film thickness is too small, the photoresist (10) scraped off before the sacrificial layer (9) becomes columnar. Conversely, when the film thickness is too large, the reactive gas species of etching, and the like become less likely to reach the member to be cut.

FIG. 2C shows a step of performing etching using the photoresist (10) as a mask and processing the sacrificial layer (9).

From the etching selectivity among respective layer materials, the sacrificial layer (9) is etched along the processed pattern shape of the photoresist (10), and the photoresist (10) itself also becomes smaller.

The etching for use in the present invention includes ion beam etching (IBE), reactive ion etching (RIE), or the like. For example, an ion beam is made incident upon a material from obliquely above with respect to the direction perpendicular to a film surface. An ion beam is applied from obliquely above for the following reason. The etched material is redeposited on the columnar side surface, and hence etching is performed while removing such a material. Herein, obliquely above indicates the range of θ=50° to 90° where θ represents the angle inclined with respect to the direction perpendicular to a film surface, which may be changed within this range during the step of etching.

FIG. 2D shows a step of removing the photoresist (10) left on the sacrificial layer (9). For removing the photoresist (10), the photoresist (10) is immersed in, for example, a special-purpose liquid remover in order to effectively remove an organic substance.

FIG. 2E shows a step of performing etching using the sacrificial layer (9) as a mask and processing the hard mask film (H) including TiN. In order to obtain etching selectivity between the sacrificial layer (9) and the hard mask film (H) including TiN, a chlorine type gas or the like is used as the etching gas species.

Figure 2F:
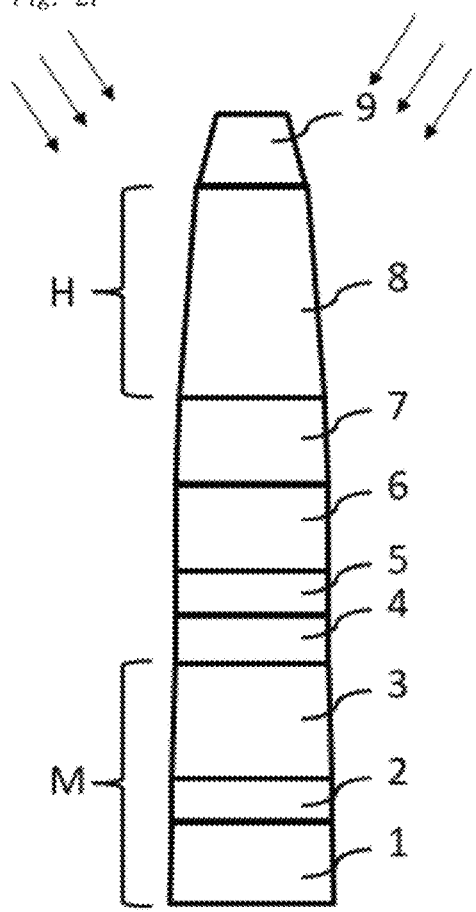
FIG. 2F is a longitudinal section view shoving one example of a configuration, and an etching state in a magnetic tunnel junction film processing step of the method for manufacturing the magnetic tunnel junction element of the present invention.

FIG. 2F shows a step of performing etching using the hard mask film (H) including TiN, and the residual sacrificial layer (9) as a mask and processing the magnetic tunnel junction film (M). In order to obtain etching selectivity between the hard mask film (H) including TiN and the magnetic tunnel junction film (M), the one including carbon, oxygen, hydrogen, or the like, or other gas species is used as the etching gas species.

From the etching selectivity among respective layer materials, the magnetic tunnel junction film (M) is cut into the shape of the hard mask film (H) cut along the processed pattern shape of the photoresist (10), and the sacrificial layer (9) itself is also cut.

Figure 2G:
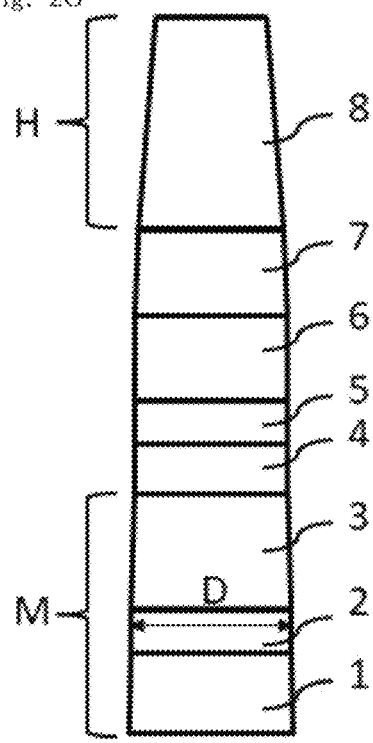
FIG. 2G is a longitudinal section view shoving one example of a configuration in a sacrificial layer removing step of the method for manufacturing the magnetic tunnel junction element of the present invention.

FIG. 2G shows a longitudinal cross section view upon completion of the step of removing the sacrificial layer (9) at the end of etching. The residual sacrificial layer (9) is little, and hence physical etching by a noble gas species such as Ar, or the like is used.

Evaluation of Magnetic Characteristics of Magnetic Tunnel Junction (MTJ) Film

An evaluation was performed on whether or not the magnetic tunnel junction element of the present invention processed in the steps as described up to this point was suppressed in diffusion of Ti or N in the hard mask film (H) into the magnetic tunnel junction film (M) as compared with a conventional element without the non-magnetic insertion layer (7).

First, an evaluation was performed an the relationship between the film thickness of Ta as the non-magnetic insertion layer (7) and the effective magnetic anisotropy constant $K_{eff}t^*$ standard value per unit area of the recording layer of the magnetic tunnel junction element.

FIG. 3A shows a configuration of an evaluating magnetic tunnel junction element. The evaluating magnetic tunnel junction element includes lower electrode (Ta (5 nm))/Ru (5 nm)/TaN (20 nm)/Pt (3 nm)/reference layer (1) (8.5 nm)/tunnel barrier layer (MgO (1.1 nm))/CoFeB (1.0 nm)/W (0.2 nm)/FeB (0.8 nm)/W (0.2 nm)/CoFeB (1.0 nm)/first protection layer (4) (MgO (1.24 nm))/second protection layer (5) (CoFeB (1.0 nm))/third protection layer (6) (Ru (5 nm))/non-magnetic insertion layer (7) (Ta (x nm))/hard mask layer (8) (TiN (90 nm)) sequentially laminated. Herein, for the reference layer, [Co (0.5 nm/Pt (0.3 nm)]$_5$/Co (0.5 nm)/Ru (0.9 nm)/[Co (0.5 nm)/Pt (0.3 nm)]$_2$/Co (0.5 nm)/W (0.3 nm)/CoFe-25B (1.2 nm) was used.

For the evaluation of the effective magnetic anisotropy constant $K_{eff}t^*$, magnetic measurement is used. However, the reference layer also has magnetism. For this reason, for the evaluation, a MTJ film of a structure in which the reference layer and the underlayer were simplified shown in FIG. 3B was used. The film thickness x of Ta of the non-magnetic insertion layer (7) was adjusted to 0 (without insertion), 1 nm, 2 nm, 3 nm, 5 nm, 10 nm, and 20 nm.

Figure 4:
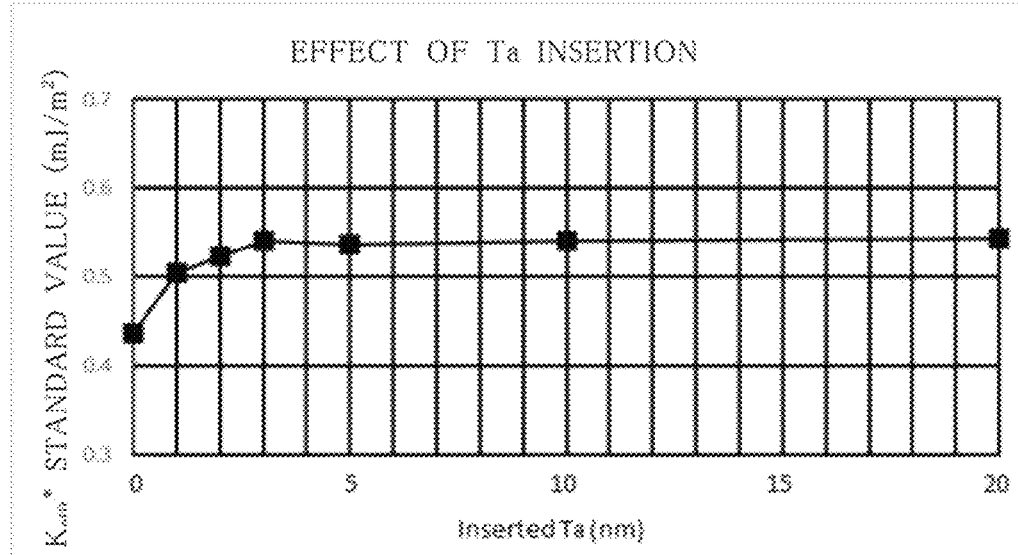
FIG. 4 is a graph showing relative to the magnetic tunnel junction element of the present invention the relationship between the presence or absence of Ta insertion and the film thickness, and the effective magnetic anisotropy constant $K_{eff}t^*$ standard value.

After lamination, an annealing treatment was performed at 400° C. for 1 hour, and the relationship with the effective magnetic anisotropy constant $K_{eff}t^*$ standard value (mJ/m$^2$) per unit area was determined, and is shown in FIG. 4.

Herein, a higher effective magnetic anisotropy constant $K_{eff}t^*$ standard value indicates that a larger perpendicular magnetic anisotropy is possessed, namely, the perpendicular magnetic anisotropy of the evaluating magnetic tunnel junction film (M') is kept. Incidentally, at present, it is assumed that art effective magnetic anisotropy constant $K_{eff}t^*$ standard value per unit area of the magnetic tunnel junction element of more than about 0.5 mJ/m$^2$ is sufficient.

FIG. 4 indicates as follows. As the film thickness of Ta increases as zero (in the case of no insertion), 1 nm, 2 nm, and 3 nm, the $K_{eff}t^*$ standard value also increases. Further, the $K_{eff}t^*$ standard value is roughly constant from more than 3 nm to 20 nm.

The evaluation up to this point indicates as follows. In the present evaluation system, as compared with the case where Ta is not inserted, when Ta is inserted as the non-magnetic insertion layer (7), the effective magnetic anisotropy constant $K_{eff}t^*$ standard value increases, insertion of 1-nm or more Ta is effective for the improvement of perpendicular magnetic anisotropy, and insertion of 3-nm or more Ta produces an effect of keeping the perpendicular magnetic anisotropy of the evaluating magnetic tunnel junction film (M') as much as possible.

Element Analysis Evaluation of Magnetic Tunnel Junction (MTJ) Film

Then, analysis was performed on how the element distribution of the magnetic tunnel junction film changes in the film thickness direction according to the presence or absence of insertion of the non-magnetic insertion layer (7).

FIG. 5A shows a longitudinal cross section view of the magnetic tunnel junction film when the non-magnetic insertion layer (7) is not inserted (conventional example).

Figure 3B:
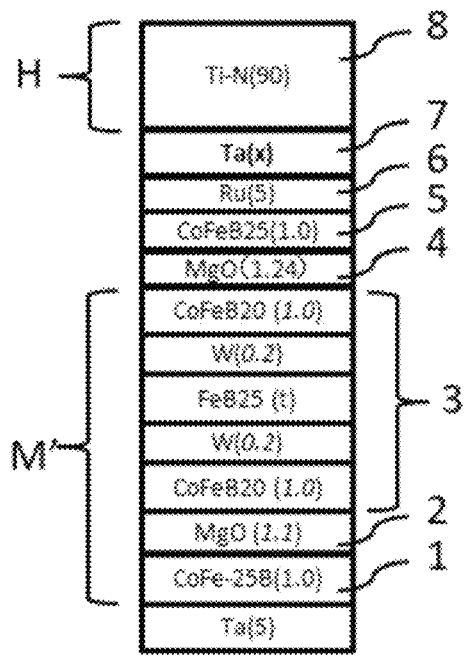
FIG. 3B is a longitudinal section view showing a configuration of an evaluating magnetic tunnel junction film.

The evaluated magnetic tunnel junction film has a similar configuration to that of the film for which the film thickness x of Ta is set at 0 in FIG. 3B. Although the recording layer (3) has a simplified structure, it essentially has the same structure. Substrate/lower electrode (Ta (5 nm))/reference layer (1) (CoFeB (1.0 nm))/tunnel barrier layer (MgO (1.0 nm))/CoFeB (1.0 nm)/W (0.5 nm)/CoFeB (1.0 nm)/first protection layer (4) (MgO (1.0 nm))/second protection layer (5) (CoFeB (1.0 nm))/third protection layer (6) (Ru (5 nm))/hard mask layer (8) (TiN (90 nm)) are sequentially laminated, and are subjected to an annealing treatment.

Figure 6A:
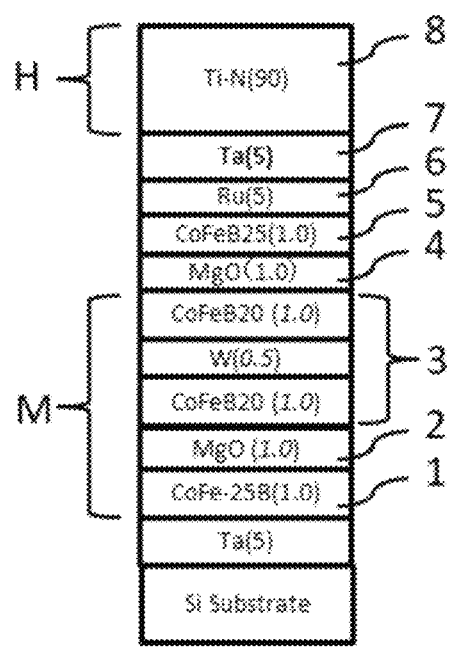
FIG. 6A is a longitudinal cross section view showing a configuration for use in SIMS analysis of a magnetic tunnel junction film with Ta insertion of the present invention.

FIG. 6A shows a longitudinal cross section view of a magnetic tunnel junction film in the case where the non-magnetic insertion layer (7) is inserted (the present invention example).

The evaluated magnetic tunnel junction film has essentially the same configuration as that of the film in the case where the film thickness x of Ta in FIG. 3B is set at 5. Substrate/lower electrode (Ta (5 nm))/reference layer (1) (CoFeB (1.0 nm))/tunnel barrier layer (MgO (1.0 nm)/CoFeB (1.0 nm)/W (0.5 nm)/CoFeB (1.0 nm)/first protection layer (4) (MgO (1.0 nm))/second protection layer (5) (CoFeB (1.0 nm))/third protection layer (5) (Ru (5 nm))/non-magnetic insertion layer (7) (Ta (5 nm))/hard mask layer (8) (TiN (90 nm)) are sequentially laminated, and are subjected to an annealing treatment.

After the annealing treatment, the element distribution in the element was analyzed by SIMS (Secondary Ion Mass Spectrometry) for the film without insertion of Ta as a conventional non-magnetic insertion layer (7). and the film with insertion of Ta of the present invention.

Figure 5B:
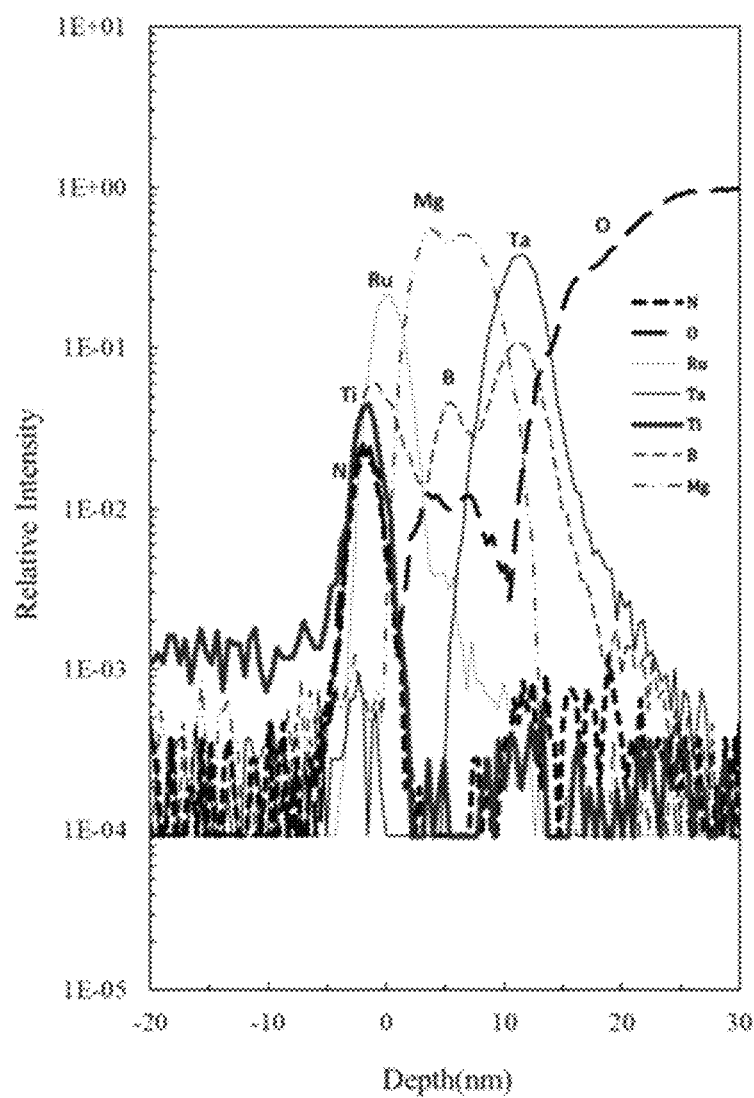
FIG. 5B is a graph showing the SIMS analysis results of the magnetic tunnel junction film without Ta insertion of a conventional example.
Figure 6B:
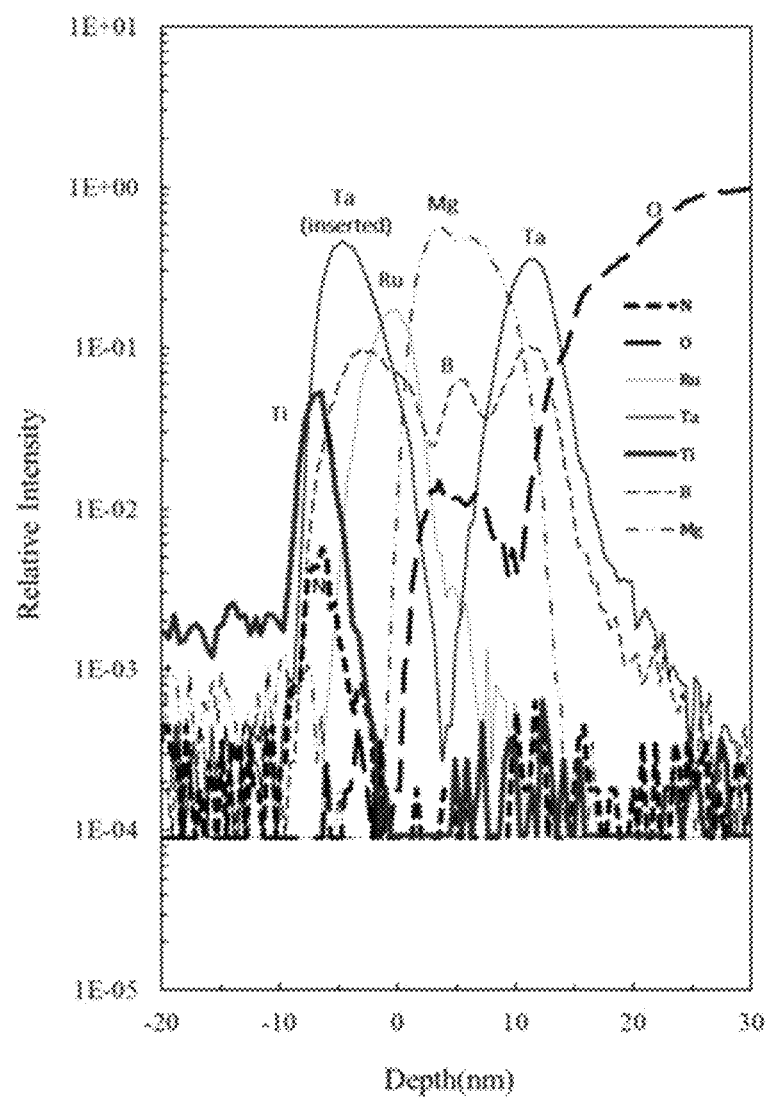
FIG. 6B is a graph showing the SIMS analysis results of the magnetic tunnel junction film with Ta insertion of the present invention.

FIG. 5B shows the analysis results of distribution of all the elements of the case where Ta as the non-magnetic insertion layer (7) is not inserted (conventional example), and FIG. 6B shows the analysis results of distribution of ail the elements of the case where Ta as the non-magnetic insertion layer (7) is inserted (the present invention example).

Figure 7:
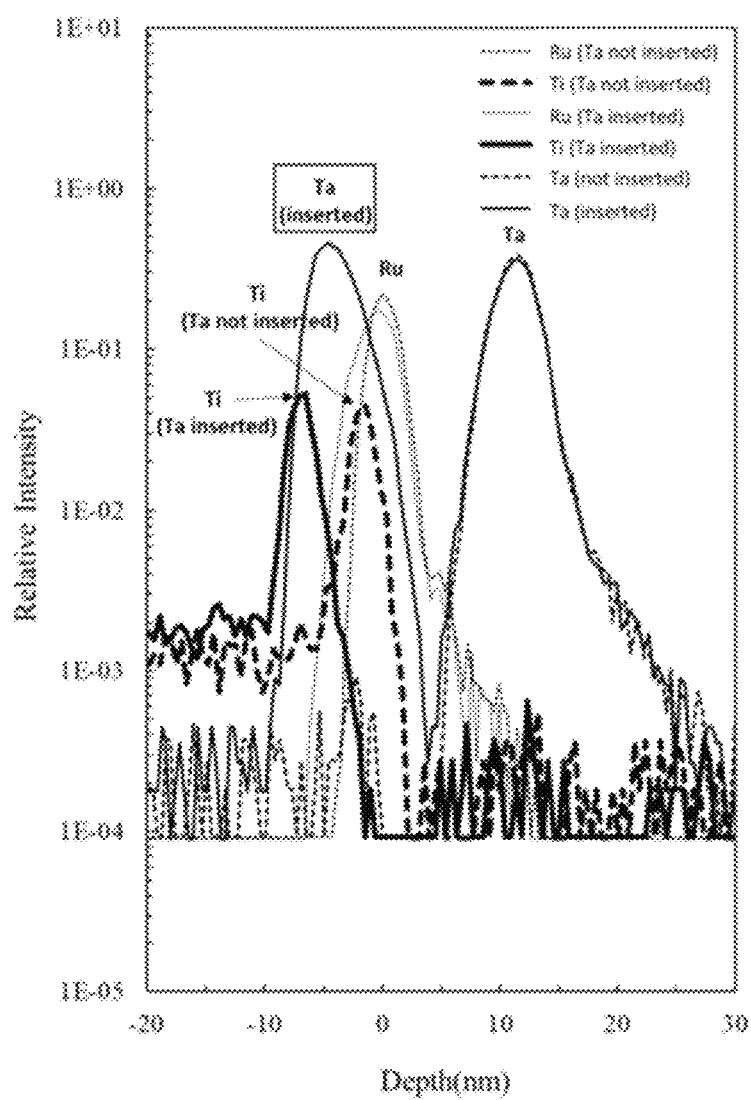
FIG. 7 is a graph showing the SIMS analysis results of Ti of the magnetic tunnel junction film (with Ta insertion) of the present invention, and the magnetic tunnel junction film (without Ta insertion) of a conventional example.

Further, FIG. 7 shows the movements of Ti element when Ta as the non-magnetic insertion layer (7) is inserted, and when is not inserted.

Figure 8:
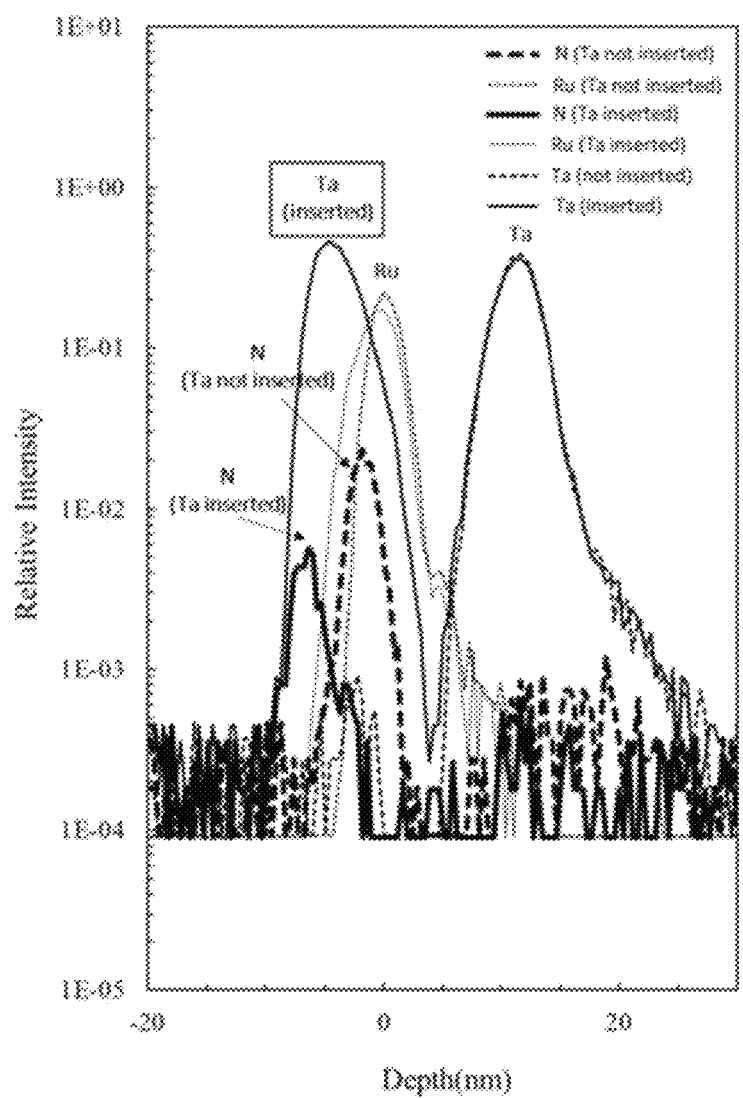
FIG. 8 is a graph showing the SIMS analysis results of N of the magnetic tunnel junction film (with Ta insertion) of the present invention, and the magnetic tunnel junction film (without Ta insertion) of a conventional example.

FIG. 8 shows the movements of the peak of N element when Ta as the non-magnetic insertion layer (7) is inserted, and when is not inserted.

Each horizontal axis of FIGS. 7 and 8 represents the relative depth from the film surface, and the element present on the upper side of the center of thickness of the Ru layer is plotted on the minus side, and the element present on the lower side is plotted on the plus side. Incidentally, conversion was carried out with the distance to the peak top of the Ta layer arranged between the substrate and the reference layer (1) from the peak top of the Ru layer as 11.5 nm, and peak matching was performed so that each origin is in the vicinity of the peak of the Ru layer for the spectra of two samples.

Each vertical axis of FIGS. 7 and 8 represents the relative intensity of each element with respect to the intensity of O in SiO$_2$.

FIG. 7 indicates as follows. Ti of TiN included in the hard mask layer (8) has a peak shifted toward the lower side of the element in the case where Ta is not inserted us the non-magnetic insertion layer (7) as compared with the case where Ta is inserted.

Further, FIG. 8 indicates as follows. N of TiN included in the hard mask layer (8) also has a peak shifted toward the lower side of the element in the case where Ta is not inserted as the non-magnetic insertion layer (7) as compared with the case where Ta is inserted.

The results of the analysis of distribution of Ti and N described up to this point indicate as follows. The presence of the Ta insertion layer of the present invention suppresses the diffusion and penetration of Ti and N into the inside of the element.

Figure 9A:
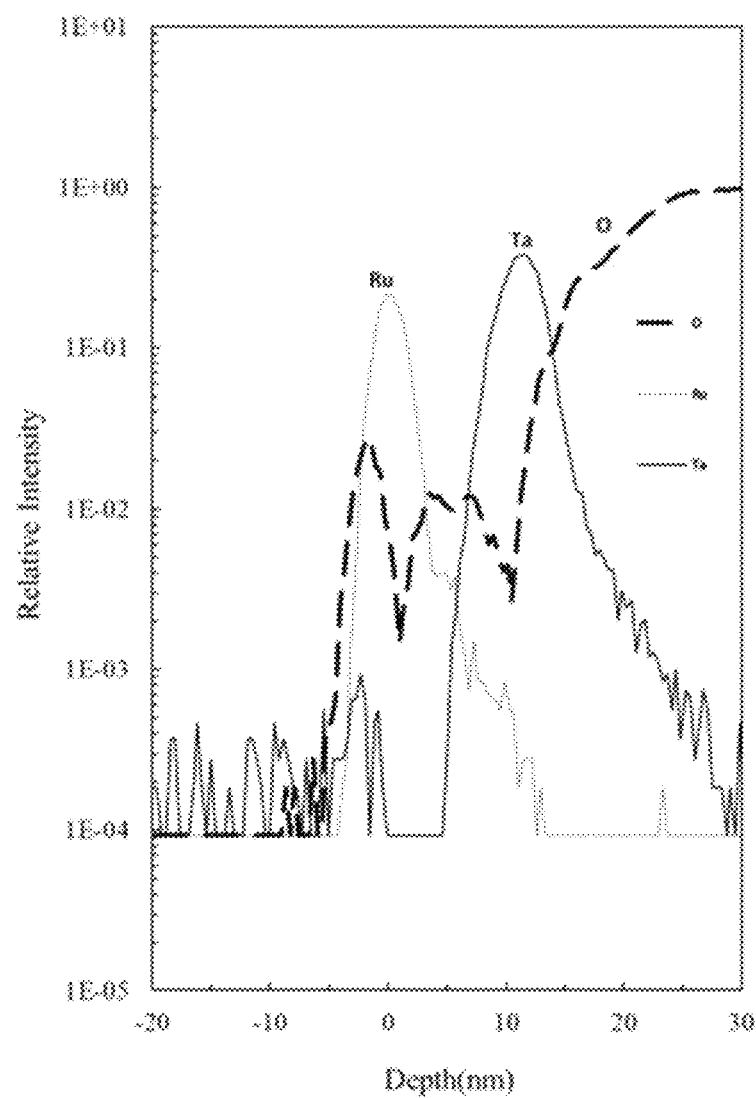
FIG. 9A is a graph showing the SIMS analysis results of O of the magnetic tunnel junction film without Ta insertion of a conventional example.

Further, FIG. 9A is a graph focusing attention on the O element of FIG. 5B showing the element distribution when Ta as the non-magnetic insertion layer (7) is not inserted.

Figure 9B:
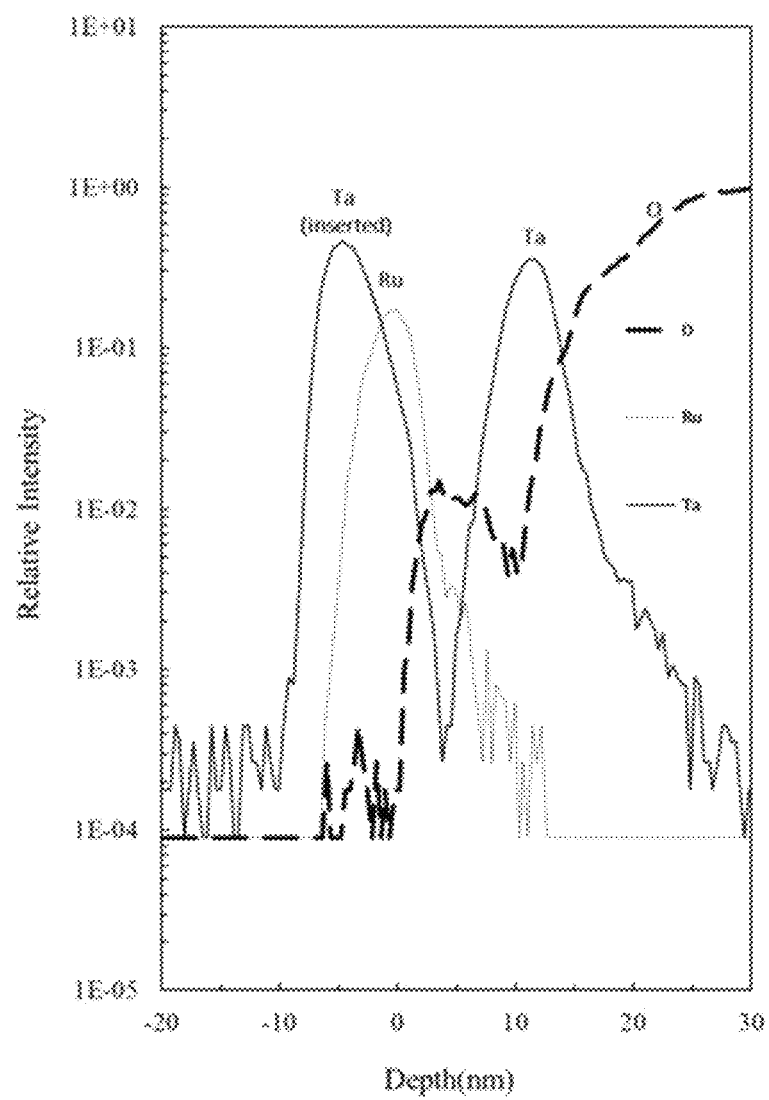
FIG. 9B is a graph showing the SIMS analysis results of O of the magnetic tunnel junction film with Ta insertion of the present invention.

Similarly, FIG. 9B is a graph focusing attention on the O element of FIG. 6B showing the element distribution when Ta as the non-magnetic insertion layer (7) is inserted. A remarkable difference is observed in distribution of O.

In the case of Ta being inserted of FIG. 9B, O element takes a peak at a depth in the vicinity of 5 nm between the Ru peak at a depth in the vicinity of 0 nm and the Ta peak at a depth in the vicinity of 10 nm. The Ru peak in the vicinity of 0 nm arises from the third protective layer (6), and Ta at a depth in the vicinity of 10 nm arises from the lower electrode at the undermost layer. Therefore, the O element peak at a depth in the vicinity of 5 nm is considered to be derived from MgO configuring the tunnel barrier layer (2) and the first protection layer (4), and is present so as to be sandwiched between the underlayer electrode layer (Ta) and the third protection layer (Ru) as the laminated layer structure of FIG. 6A. On the other hand, in the case of Ta not being inserted of FIG. 9A, the O element has one peak at a position at a depth in the vicinity of 5 nm sandwiched between Ta included in the underlayer electrode layer and Ru of the protection layer (6), and another peak on the surface side above Ru. From the laminated layer structure (FIG. 5A), this is not considered due to the penetration of oxygen from the surface because TiN as thick as 90 nm is present on Ru. For this reason, it can be considered that the peak of the O element on Ru of the third protective layer (6) emerges due to the following. Oxygen of MgO configuring the first protection layer (4) or the tunnel barrier layer (2) separates and is diffused in the surface direction.

From the results of O distribution analysis described up to this point, it is considered that the presence of the Ta insertion layer as with the magnetic tunnel junction element of the present invention suppresses the decomposition of MgO of the first protection layer (4) or the tunnel hairier layer (2).

The formation of the magnetic tunnel junction film is performed using sputtering. For the hard mask layer (8) of TiN, using a sputtering target of metal Ti, and introducing a mixed gas of Ar and N2, sputtering is performed with the target surface being in a metal state. N which has become a plasma is incorporated into film on the wafer side. However, the incorporated amount is small, and hence the resulting TiN film is not of a composition of stoichiometric composition of 1:1, but is a Ti-rich TiN film. The element of Ti has very high reactivity with oxygen, and hence Ti in TiN is still in an active state. Conceivably, in the case where the Ta insertion layer is present, even when active Ti is present on the film surface, Ta becomes a barrier. For this reason, also in the high-temperature annealing treatment, the O element of MgO forming the first protection layer or the tunnel junction layer will not be attracted by Ti on the surface. In contrast, in the case of no Ta insertion layer, there is no barrier, and hence the O element of MgO forming the first protection layer (4) or the tunnel barrier layer (2) is attracted by Ti on the surface, so that decomposition of MgO proceeds.

In other words, it has been shown as follows. When Ta is inserted as the non-magnetic insertion layer (7) of the present invention, diffusion of Ti and N of the hard mask layer (8), and decomposition of MgO of the first protection layer (4) or the tunnel barrier layer (2) are suppressed. It has been shown that the magnetic tunnel junction element of the present invention having Ta inserted therein also keeps higher perpendicular magnetic anisotropy by the annealing treatment as compared with a conventional element.

Evaluation of Coercivity and Shift Magnetic Field of Magnetic Tunnel Junction (MTJ) Element Further, evaluation was carried out on variations in coercivity and variations in shift magnetic field of the magnetic tunnel junction element (with Ta insertion) of the present invention and the magnetic tunnel junction element (without Ta insertion) of a conventional example.

Using two kinds of magnetic tunnel junction films with and without a Ta insertion layer (x=0 nm, 5 nm) shown in FIG. 13, the process shown from FIGS. 2A to 2G was performed thereon, thereby manufacturing a fine element of the structure of FIG. 2G. The dimension D shown in FIG. 2G represents the major axis of a substantially elliptical element.

Figure 10:
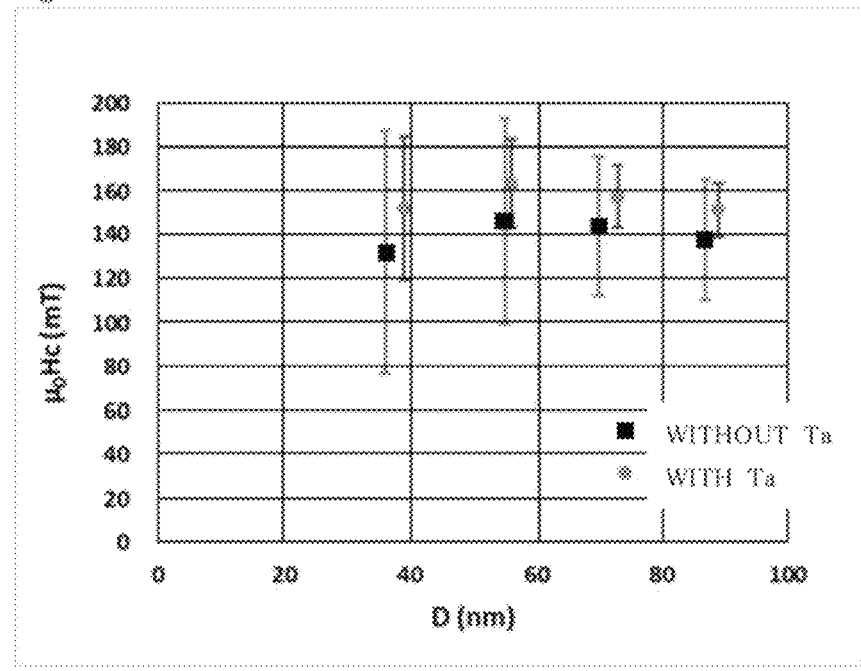
FIG. 10 is a graph showing the coercivity of the magnetic tunnel junction element (with Ta insertion) of the present invention, and the magnetic tunnel junction dement (without Ta insertion) of a conventional example.

FIG. 10 shows the relationship between the major axis and the coercivity $\mu_0/H_c$ (mT) of the magnetic tunnel junction element according to the presence or absence of the Ta insertion layer of the non-magnetic insertion layer (7). A large number of elements having a dimension D were measured. From a large number of measurement results of the coercivity of a large number of elements, the average value and the standard deviation $\sigma$ of the coercivity were determined. The average value and the value of the average value $\pm\sigma$ are plotted in the drawing. The symbol of ● or ■ marked in FIG. 10 indicates the measured average value of a plurality of elements having each element dimension D, and the bar indicates the range of the average value $\pm\sigma$. The drawing indicates as follows. As compared with the case without the Ta insertion layer, for the magnetic tunnel junction element having the Ta insertion layer, the variations in coercivity among the elements are smaller, the range of variations is almost ½. and an element group having smaller variations in characteristics can be manufactured. Particularly, when the element size is 60 nm or less, tie effects are remarkable. Further, the inclusion of the Ta insertion layer results in an increase in average value of the coercivity, and also results in an increase in coercivity of an element having the minimum value.

The coercivity possessed by each dement represents the recording information holding ability possessed by each element. It is indicated as follows. Inclusion of the Ta insertion layer can produce the information recording holding ability improving effect as the aggregate of the plurality of elements. This indicates as follows. Assuming an integrated element configured as the aggregate of a plurality of elements, u more excellent integrated element can be provided.

Incidentally, the values of the element size plotted in FIG. 10 are 39 nm, 56 nm, 73 nm, and 89 nm from the left when the Ta insertion layer is included therein, and the values are 36 nm, 55 nm, 70 nm, and 87 nm from the left when the Ta insertion layer is not included therein.

Figure 11:
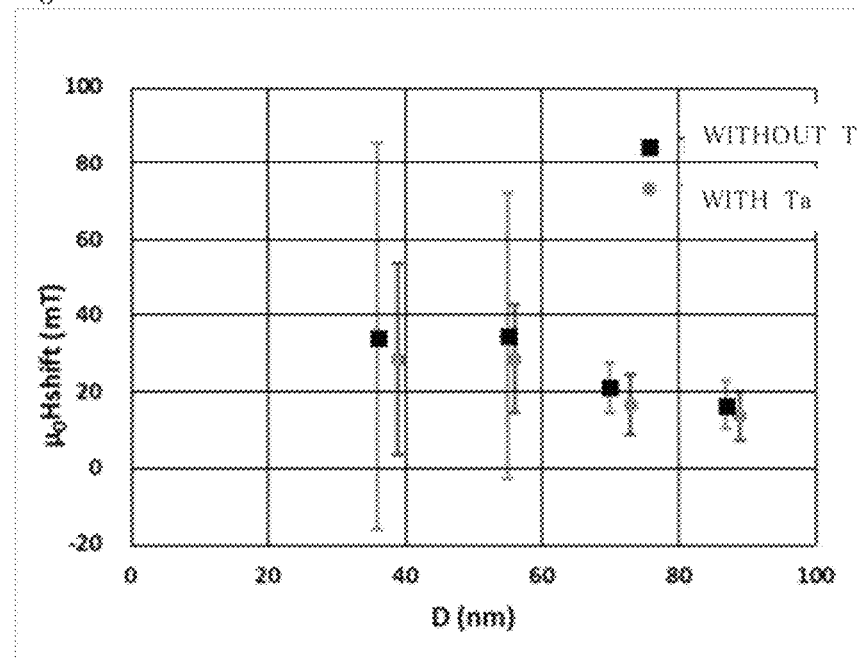
FIG. 11 is a graph showing the shift magnetic field of the magnetic tunnel junction element (with Ta insertion) of the present invention, and the magnetic tunnel junction element (without Ta insertion) of a conventional example.

FIG. 11 shows the relationship between the major axis and the shift magnetic field $\mu_0 H_{shift}$ (mT) of the magnetic tunnel junction element according to the presence or absence of the Ta insertion layer of the non-magnetic insertion layer (7). A large number of elements having a dimension D were measured.

As with FIG. 10, from a large number of shift magnetic held measurement results of a large number of elements, the average value and the standard deviation $\sigma$ of the shift magnetic field were determined, and the average value and the value of the average value ±σ are plotted in the drawing for each element dimension. The symbol of ● or ■ marked in FIG. 11 indicates the measured average value of a plurality of elements having each element dimension D, and the bar indicates the range of the average value ±σ. It has been indicated as follows. As compared with the case without the Ta insertion layer, within the range of an element size D of 60 nm or less, for the magnetic tunnel junction element having the Ta insertion layer, the average value of the shift magnetic field is a little smaller, and the variations in shift magnetic field are as remarkably small as 40% or less (about 35%, about 37% in evaluation value).

Incidentally, the values of the element size plotted in FIG. 11 are 39 nm, 56 nm, 73 nm, and 89 nm from the left when the Ta insertion layer is included therein, and the values are 36 nm, 55 nm, 70 nm, and 87 nm from the left when the Ta insertion layer is not included therein.

The shift magnetic field possessed by each element is related to a difference in holding ability for two recording information of "1" and "0" possessed by respective elements. This value being a finite value results in high information holding ability of "1", and low information holding ability of "0". Therefore, with an element, having a larger shift magnetic field, it becomes more difficult to hold information of "0". When the Ta insertion layer is included therein, as compared with the case where the Ta insertion layer is not included therein, the maximum value of the shift magnetic field is small at all sizes D. This means that when a comparison is made between the element aggregates with and without the Ta insertion layer as the aggregate of a plurality of elements, the element aggregate with the Ta insertion layer has a higher minimum value of information recording holding ability. This indicates that when an integrated element configured as the aggregate of a plurality of elements is assumed, a more excellent integrated element can be provided.

The evaluation results of the coercivity and the shift magnetic field described up to this point indicates as follows. The magnetic tunnel junction element including Ta of the non-magnetic insertion layer (7) of the present invention inserted therein has a higher element integrating potential as compared with a conventional example without insertion.

Embodiment 2

Incidentally, a description has been given so far to a configuration of an element, a method for manufacturing an element, and the evaluation results as one example of Embodiment 1. However, the second protection layer (5) or the third protection layer (6) of the protection layers of Embodiment 1 are not required to be provided.

FIG. 12 shows a configuration of a magnetic tunnel junction element of Embodiment 2 not including the third protection layer (6) of Embodiment 1. The basic configuration of the magnetic tunnel junction element includes reference layer (1)/tunnel barrier layer (2)/recording layer (3)/first protection layer (4)/second protection layer (5)/non-magnetic insertion layer (7)/hard mask layer (8) sequentially arranged adjacent to one another. The reference layer (1)/tunnel barrier layer (2)/recording layer (3) configure a magnetic tunnel junction film (M), and the hard mask layer (8) configures a hard mask film (H).

Incidentally, for Embodiment 2, any layer configuration shown in FIG. 12 is acceptable so long as the layers are arranged sequentially adjacent to one another, and there is no restriction on the lamination method, the lamination order, the vertical and horizontal orientation, and the like.

Embodiment 2 has the same features as those of Embodiment 1 except for not having the third protection layer (6).

Further, even with the configuration of Embodiment 2 not including the third protection layer, the non-magnetic insert on layer (7) of Ta or the like having the features and effects described in details in Embodiment 1 can suppress the constituent elements of Ti and N from being diffused and penetrating into the magnetic tunnel junction film (M) from the hard mask layer (8). and can suppress the decomposition of the oxide forming the first protection layer (4) or the tunnel barrier layer (2). For this reason, even when an annealing treatment is performed, it is possible to suppress the deterioration of the perpendicular magnetic anisotropy of the magnetic tunnel junction film (M), and it is possible to obtain a magnetic tunnel junction element having higher perpendicular magnetic anisotropy as with Embodiment 1.

Embodiment 2 has an element configuration not including the third protection layer (6). However, even with an element configuration not including the second protection layer (5), similarly, the non-magnetic insertion layer (7) of Ta or the like can suppress the constituent elements of Ti and N from being diffused and penetrating into the magnetic tunnel junction film (M) from the hard mask layer (8), and can suppress the decomposition of the oxide forming the first protection layer (4) or the tunnel barrier layer (2). For this reason, even when an annealing treatment is performed, it is possible to suppress the deterioration of the perpendicular magnetic anisotropy of the magnetic tunnel junction film (M). and it is possible to obtain a magnetic tunnel junction element having higher perpendicular magnetic anisotropy as with Embodiment 1 or 2.

Other Embodiments

Further, the magnetic layer of the recording layer may be one layer of a magnetic layer, or may have a layer configuration including a plurality of magnetic layers and non-magnetic coupling layers inserted between the layers, respectively. Such a non-magnetic coupling layer may be the one for reversing the magnetization directions of the adjacent two magnetic layers in the same direct ion (ferromagnetic coupling), or the one for reversing he magnetization directions of the adjacent two magnetic layers in the anti-parallel direction (antiferromagnetic coupling).

Further, the recording layer and the reference layer may be reversed, and a plurality of respective layers may be included.

Reference Signs List

1 Reference layer
2 Tunnel barrier layer
3 Recording layer
4 First protection layer
5 Second protection layer
6 Third protection layer
7 Non-magnetic insertion layer
8 Hard mask layer
9 Sacrificial layer
10 Photoresist
M Magnetic tunnel junction film
H Hard mask film

The invention claimed is:

1. A magnetic tunnel junction element, comprising:
a reference layer having a magnetization direction that is fixed;
a tunnel barrier layer disposed adjacent to the reference layer;
a recording layer having a magnetization direction that is variable, and disposed adjacent to the tunnel barrier layer on an opposite side thereof to the reference layer;
a first protection layer disposed adjacent to the recording layer on an opposite side thereof to the tunnel barrier layer;
a second protection layer disposed adjacent to the first protection layer on an opposite side thereof to the recording layer;
a non-magnetic insertion layer disposed adjacent to the second protection layer on an opposite side thereof to the first protection layer; and
a hard mask layer disposed in a direct contact with the non-magnetic insertion layer on an opposite side thereof to the second protection layer,
wherein
the reference layer includes a ferromagnetic body,
the tunnel barrier layer includes O,
the recording layer includes a ferromagnetic body including at least any of Co, Fe, or Ni,
the first protection layer includes O,
the second protection layer includes at least one from the group consisting of Ru, Co, Fe, CoB, FeB, CoFe, or CoFeB,
the non-magnetic insertion layer includes at least one from the group consisting of Ta, Nb, Mo, Hf, W, or Pt, and a film thickness of the non-magnetic insertion layer is 1 nm or more, and 10 nm or less,
the hard mask layer is a metal material including Ti or N, and
the reference layer, the tunnel barrier layer, and the recording layer configure a magnetic tunnel junction film (M) and a magnetization direction of each of the reference layer and the recording layer is perpendicular to a film surface.

2. A magnetic memory comprising the magnetic tunnel junction element according to claim 1.

3. The magnetic tunnel junction element according to claim 1, wherein the non-magnetic insertion layer is Ta.

4. The magnetic tunnel junction element according to claim 3, wherein the first protection layer is MgO.

5. The magnetic tunnel junction element according to claim 1, further comprising a third protection layer disposed adjacent to and between the second protection layer and the non-magnetic insertion layer, wherein
the third protection layer includes at least one from the group consisting of Ru, Rh, Cu, Ir, Au, Hf, W, Zr, Nb, Mo, Ti, V, or Cr, or an alloy thereof.

6. A magnetic memory comprising the magnetic tunnel junction element according to claim 5.

7. A method for manufacturing a magnetic tunnel junction element, the method comprising:
sequentially laminating a magnetic tunnel junction film (M) including at least a reference layer, a tunnel barrier layer, and a recording layer, a first protection layer, a second protection layer, a non-magnetic insertion layer, and a hard mask layer;
annealing the laminated film;
laminating a sacrificial layer including at least Si on the hard mask layer subjected to annealing;
forming a photoresist having, on a part of the sacrificial layer, a processed pattern shape of the magnetic tunnel junction film (M) in a top view;
performing etching using the photoresist as a mask and processing the sacrificial layer;
performing etching using the sacrificial layer as a mask and processing the hard mask layer;
performing etching using the hard mask layer as a mask and processing the magnetic tunnel junction film (M); and
removing the sacrificial layer,
wherein:
the reference layer includes a ferromagnetic body,
the tunnel barrier layer includes O,
the recording layer includes a ferromagnetic body including at least any of Co, Fe, or Ni,
the first protection layer includes O,
the second protection layer includes at least one from the group consisting of Ru, Co, Fe, CoB, FeB, CoFe, or CoFeB,
the non-magnetic insertion layer includes at least one from the group consisting of Ta, Nb, Mo, Hf, W, or Pt, and a film thickness of the non-magnetic insertion layer is 1 nm or more, and 10 nm or less,
the hard mask layer is a metal material including Ti or N, and
a magnetization direction of each of the reference layer and the recording layer is perpendicular to a film surface.

8. The method for manufacturing a magnetic tunnel junction element according to claim 7, further comprising a third protection layer disposed adjacent to and between the second protection layer and the non-magnetic insertion layer, wherein
the third protection layer includes at least one from the group consisting of Ru, Rh, Cu, Ir, Au, Hf, W, Zr, Nb, Mo, Ti, V, or Cr, or an alloy thereof.

9. The method for manufacturing a magnetic tunnel junction element according to claim 7, wherein in the annealing, an annealing temperature is about 400° C., and annealing time is 1 hour.

10. The method for manufacturing a magnetic tunnel junction element according to claim 9, wherein the etching in the processing the hard mask layer, and the etching in the processing the magnetic tunnel junction film (M) are each reactive ion etching or ion beam etching, and an incident angle of an ion beam is 50° to 90° with respect to a direction perpendicular to a film surface.

* * * * *